(12) United States Patent
Chen et al.

(10) Patent No.: US 9,355,863 B2
(45) Date of Patent: *May 31, 2016

(54) NON-LOCAL PLASMA OXIDE ETCH

(71) Applicant: Applied Materials, Inc., Santa Clara, CA (US)

(72) Inventors: Zhijun Chen, San Jose, CA (US); Seung Park, San Jose, CA (US); Mikhail Korolik, San Jose, CA (US); Anchuan Wang, San Jose, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/828,311

(22) Filed: Aug. 17, 2015

(65) Prior Publication Data

US 2015/0357201 A1  Dec. 10, 2015

Related U.S. Application Data

(63) Continuation of application No. 13/790,668, filed on Mar. 8, 2013, now Pat. No. 9,111,877.

(60) Provisional application No. 61/738,855, filed on Dec. 18, 2012.

(51) Int. Cl.
  *H01L 21/302* (2006.01)
  *H01L 21/311* (2006.01)
  *H01J 37/32* (2006.01)

(52) U.S. Cl.
  CPC ....... *H01L 21/31122* (2013.01); *H01J 37/3244* (2013.01); *H01J 37/32357* (2013.01); *H01J 37/32422* (2013.01)

(58) Field of Classification Search
  None
  See application file for complete search history.

(56) References Cited

U.S. PATENT DOCUMENTS

| 2,369,620 A | 2/1945 | Sullivan et al. |
| 3,451,840 A | 6/1969 | Hough |

(Continued)

FOREIGN PATENT DOCUMENTS

| KR | 10-2003-0054726 A | 7/2003 | |
| KR | 20030054726 A * | 7/2003 | ............ H01L 21/302 |

(Continued)

OTHER PUBLICATIONS

Norasetthekul, S. et al "Dry etch chemistries for TiO2 thin films" Applied Surface Science 2001, 185 (1-2) 27-33.*

(Continued)

*Primary Examiner* — Anita Alanko
(74) *Attorney, Agent, or Firm* — Kilpatrick Townsend & Stockton LLP

(57) ABSTRACT

A method of etching exposed titanium oxide on heterogeneous structures is described and includes a remote plasma etch formed from a fluorine-containing precursor. Plasma effluents from the remote plasma are flowed into a substrate processing region where the plasma effluents may combine with a nitrogen-containing precursor such as an amine (N:) containing precursor. Reactants thereby produced etch the patterned heterogeneous structures with high titanium oxide selectivity while the substrate is at elevated temperature. Titanium oxide etch may alternatively involve supplying a fluorine-containing precursor and a source of nitrogen-and-hydrogen-containing precursor to the remote plasma. The methods may be used to remove titanium oxide while removing little or no low-K dielectric, polysilicon, silicon nitride or titanium nitride.

20 Claims, 5 Drawing Sheets

(56) References Cited

U.S. PATENT DOCUMENTS

| | | |
|---|---|---|
| 3,937,857 A | 2/1976 | Brummett et al. |
| 3,969,077 A | 7/1976 | Hill |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,364,803 A | 12/1982 | Nidola et al. |
| 4,368,223 A | 1/1983 | Kobayashi et al. |
| 4,374,698 A | 2/1983 | Sanders et al. |
| 4,381,441 A | 4/1983 | Desmarais et al. |
| 4,397,812 A | 8/1983 | Mallory, Jr. |
| 4,468,413 A | 8/1984 | Bachmann |
| 4,565,601 A | 1/1986 | Kakehi et al. |
| 4,579,618 A | 4/1986 | Celestino et al. |
| 4,585,920 A | 4/1986 | Hoog et al. |
| 4,625,678 A | 12/1986 | Shloya et al. |
| 4,632,857 A | 12/1986 | Mallory, Jr. |
| 4,656,052 A | 4/1987 | Satou et al. |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,838,990 A | 6/1989 | Jucha et al. |
| 4,851,370 A | 7/1989 | Doklan et al. |
| 4,857,140 A | 8/1989 | Loewenstein |
| 4,865,685 A | 9/1989 | Palmour |
| 4,868,071 A | 9/1989 | Walsh et al. |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,904,621 A | 2/1990 | Lowenstein et al. |
| 4,913,929 A | 4/1990 | Moslehi et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,991,542 A | 2/1991 | Kohmura et al. |
| 4,992,136 A | 2/1991 | Tachi et al. |
| 4,994,404 A | 2/1991 | Sheng et al. |
| 5,000,113 A | 3/1991 | Wang et al. |
| 5,013,691 A | 5/1991 | Lory et al. |
| 5,028,565 A | 7/1991 | Chang |
| 5,030,319 A | 7/1991 | Nishino et al. |
| 5,061,838 A | 10/1991 | Lane et al. |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,203,911 A | 4/1993 | Sricharoenchalkit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,270,125 A | 12/1993 | America et al. |
| 5,271,972 A | 12/1993 | Kwok et al. |
| 5,275,977 A | 1/1994 | Otsubo et al. |
| 5,279,669 A | 1/1994 | Lee |
| 5,279,865 A | 1/1994 | Chebi et al. |
| 5,288,518 A | 2/1994 | Homma |
| 5,290,382 A | 3/1994 | Zarowin et al. |
| 5,300,463 A | 4/1994 | Cathey et al. |
| 5,302,233 A | 4/1994 | Kim et al. |
| 5,306,530 A | 4/1994 | Strongin et al. |
| 5,314,724 A | 5/1994 | Tsukune et al. |
| 5,319,247 A | 6/1994 | Matsuura |
| 5,326,427 A | 7/1994 | Jerbic |
| 5,328,218 A | 7/1994 | Lowrey et al. |
| 5,328,558 A | 7/1994 | Kawamura et al. |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,599,740 A | 2/1997 | Jang et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,674,787 A | 10/1997 | Zhao et al. |
| 5,676,758 A | 10/1997 | Hasgawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |

(56) References Cited

U.S. PATENT DOCUMENTS

| | | |
|---|---|---|
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,789,300 A | 8/1998 | Fulford |
| 5,800,686 A | 9/1998 | Littau et al. |
| 5,804,259 A | 9/1998 | Robles |
| 5,812,403 A | 9/1998 | Fong et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,856,240 A | 1/1999 | Sinha et al. |
| 5,858,876 A | 1/1999 | Chew |
| 5,866,483 A | 2/1999 | Shiau et al. |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,915,190 A | 6/1999 | Pirkle |
| 5,918,116 A | 6/1999 | Chittipeddi |
| 5,920,792 A | 7/1999 | Lin |
| 5,926,737 A | 7/1999 | Ameen et al. |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 6,004,884 A | 12/1999 | Abraham |
| 6,007,635 A | 12/1999 | Mahawill |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,147 A | 6/2000 | Koshiishi |
| 6,072,227 A | 6/2000 | Yau et al. |
| 6,077,780 A | 6/2000 | Dubin |
| 6,080,529 A | 6/2000 | Ye et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,120,640 A | 9/2000 | Shih et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,450 B1 | 1/2001 | Patrick et al. |
| 6,174,812 B1 | 1/2001 | Hsuing et al. |
| 6,176,198 B1 | 1/2001 | Kao et al. |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,184,121 B1 | 2/2001 | Buchwalter et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |

(56) References Cited

U.S. PATENT DOCUMENTS

| | | | |
|---|---|---|---|
| 6,258,223 | B1 | 7/2001 | Cheung et al. |
| 6,258,270 | B1 | 7/2001 | Hilgendorff et al. |
| 6,261,637 | B1 | 7/2001 | Oberle |
| 6,277,733 | B1 | 8/2001 | Smith |
| 6,277,752 | B1 | 8/2001 | Chen |
| 6,277,763 | B1 | 8/2001 | Kugimiya et al. |
| 6,281,072 | B1 | 8/2001 | Li et al. |
| 6,281,135 | B1 | 8/2001 | Han et al. |
| 6,291,282 | B1 | 9/2001 | Wilk et al. |
| 6,291,348 | B1 | 9/2001 | Lopatin et al. |
| 6,303,044 | B1 | 10/2001 | Koemtzopoulos |
| 6,303,418 | B1 | 10/2001 | Cha et al. |
| 6,312,554 | B1 | 11/2001 | Ye |
| 6,312,995 | B1 | 11/2001 | Yu |
| 6,319,387 | B1 | 11/2001 | Krishnamoorthy et al. |
| 6,322,716 | B1 | 11/2001 | Qiao et al. |
| 6,323,128 | B1 | 11/2001 | Sambucetti et al. |
| 6,335,288 | B1 | 1/2002 | Kwan et al. |
| 6,340,435 | B1 | 1/2002 | Bjorkman et al. |
| 6,342,733 | B1 | 1/2002 | Hu et al. |
| RE37,546 | E | 2/2002 | Mahawili |
| 6,344,410 | B1 | 2/2002 | Lopatin et al. |
| 6,350,320 | B1 | 2/2002 | Sherstinsky et al. |
| 6,350,697 | B1 | 2/2002 | Richardson |
| 6,351,013 | B1 | 2/2002 | Luning et al. |
| 6,352,081 | B1 | 3/2002 | Lu et al. |
| 6,355,573 | B1 | 3/2002 | Okumura |
| 6,364,949 | B1 | 4/2002 | Or et al. |
| 6,364,954 | B2 | 4/2002 | Umotoy et al. |
| 6,364,957 | B1 | 4/2002 | Schneider et al. |
| 6,375,748 | B1 | 4/2002 | Yudovsky et al. |
| 6,376,386 | B1 | 4/2002 | Oshima |
| 6,379,575 | B1 | 4/2002 | Yin et al. |
| 6,383,951 | B1 | 5/2002 | Li |
| 6,387,207 | B1 | 5/2002 | Janakiraman et al. |
| 6,391,753 | B1 | 5/2002 | Yu |
| 6,395,150 | B1 | 5/2002 | Van Cleemput et al. |
| 6,403,491 | B1 | 6/2002 | Liu et al. |
| 6,415,736 | B1 | 7/2002 | Hao et al. |
| 6,416,647 | B1 | 7/2002 | Dordi et al. |
| 6,418,874 | B1 | 7/2002 | Cox et al. |
| 6,423,284 | B1 | 7/2002 | Arno |
| 6,427,623 | B2 | 8/2002 | Ko |
| 6,432,819 | B1 | 8/2002 | Pavate et al. |
| 6,432,831 | B2 | 8/2002 | Dhindsa et al. |
| 6,436,193 | B1 | 8/2002 | Kasai et al. |
| 6,436,816 | B1 | 8/2002 | Lee et al. |
| 6,440,863 | B1 | 8/2002 | Tsai et al. |
| 6,441,492 | B1 | 8/2002 | Cunningham |
| 6,446,572 | B1 | 9/2002 | Brcka |
| 6,448,537 | B1 | 9/2002 | Nering |
| 6,458,718 | B1 | 10/2002 | Todd |
| 6,461,974 | B1 | 10/2002 | Ni et al. |
| 6,462,371 | B1 | 10/2002 | Weimer et al. |
| 6,465,366 | B1 | 10/2002 | Nemani et al. |
| 6,477,980 | B1 | 11/2002 | White et al. |
| 6,479,373 | B2 | 11/2002 | Dreybrodt et al. |
| 6,488,984 | B1 | 12/2002 | Wada et al. |
| 6,494,959 | B1 | 12/2002 | Samoilov et al. |
| 6,499,425 | B1 | 12/2002 | Sandhu et al. |
| 6,500,728 | B1 | 12/2002 | Wang |
| 6,503,843 | B1 | 1/2003 | Xia et al. |
| 6,506,291 | B2 | 1/2003 | Tsai et al. |
| 6,509,623 | B2 | 1/2003 | Zhao |
| 6,516,815 | B1 | 2/2003 | Stevens et al. |
| 6,518,548 | B2 | 2/2003 | Sugaya et al. |
| 6,527,968 | B1 | 3/2003 | Wang et al. |
| 6,528,409 | B1 | 3/2003 | Lopatin et al. |
| 6,537,733 | B2 | 3/2003 | Campana et al. |
| 6,541,397 | B1 | 4/2003 | Bencher |
| 6,541,671 | B1 | 4/2003 | Martinez et al. |
| 6,544,340 | B2 | 4/2003 | Yudovsky |
| 6,547,977 | B1 | 4/2003 | Yan et al. |
| 6,551,924 | B1 | 4/2003 | Dalton et al. |
| 6,565,729 | B2 | 5/2003 | Chen et al. |
| 6,569,773 | B1 | 5/2003 | Gellrich et al. |
| 6,573,030 | B1 | 6/2003 | Fairbairn et al. |
| 6,573,606 | B2 | 6/2003 | Sambucetti et al. |
| 6,586,163 | B1 | 7/2003 | Okabe et al. |
| 6,596,599 | B1 | 7/2003 | Guo |
| 6,596,654 | B1 | 7/2003 | Bayman et al. |
| 6,602,434 | B1 | 8/2003 | Hung et al. |
| 6,603,269 | B1 | 8/2003 | Vo et al. |
| 6,605,874 | B2 | 8/2003 | Leu et al. |
| 6,616,967 | B1 | 9/2003 | Test |
| 6,627,532 | B1 | 9/2003 | Gaillard et al. |
| 6,635,578 | B1 | 10/2003 | Xu et al. |
| 6,638,810 | B2 | 10/2003 | Bakli et al. |
| 6,645,301 | B2 | 11/2003 | Sainty et al. |
| 6,645,550 | B1 | 11/2003 | Cheung et al. |
| 6,656,831 | B1 | 12/2003 | Lee et al. |
| 6,656,837 | B2 | 12/2003 | Xu et al. |
| 6,663,715 | B1 | 12/2003 | Yuda et al. |
| 6,677,242 | B1 | 1/2004 | Liu et al. |
| 6,679,981 | B1 | 1/2004 | Pan et al. |
| 6,713,356 | B1 | 3/2004 | Skotnicki et al. |
| 6,713,835 | B1 | 3/2004 | Horak et al. |
| 6,717,189 | B2 | 4/2004 | Inoue et al. |
| 6,720,213 | B1 | 4/2004 | Gambino et al. |
| 6,740,585 | B2 | 5/2004 | Yoon et al. |
| 6,740,977 | B2 | 5/2004 | Ahn et al. |
| 6,743,473 | B1 | 6/2004 | Parkhe et al. |
| 6,743,732 | B1 | 6/2004 | Lin et al. |
| 6,756,235 | B1 | 6/2004 | Liu et al. |
| 6,759,261 | B2 | 7/2004 | Shimokohbe et al. |
| 6,762,127 | B2 | 7/2004 | Boiteux et al. |
| 6,762,435 | B2 | 7/2004 | Towle |
| 6,764,958 | B1 | 7/2004 | Nemani et al. |
| 6,765,273 | B1 | 7/2004 | Chau et al. |
| 6,767,834 | B2 | 7/2004 | Chung et al. |
| 6,772,827 | B2 | 8/2004 | Keller et al. |
| 6,794,290 | B1 | 9/2004 | Papasouliotis et al. |
| 6,794,311 | B2 | 9/2004 | Huang et al. |
| 6,796,314 | B1 | 9/2004 | Graff et al. |
| 6,797,189 | B2 | 9/2004 | Hung et al. |
| 6,800,830 | B2 | 10/2004 | Mahawili |
| 6,802,944 | B2 | 10/2004 | Ahmad et al. |
| 6,808,564 | B2 | 10/2004 | Dietze |
| 6,808,748 | B2 | 10/2004 | Kapoor et al. |
| 6,821,571 | B2 | 11/2004 | Huang |
| 6,823,589 | B2 | 11/2004 | White et al. |
| 6,830,624 | B2 | 12/2004 | Janakiraman et al. |
| 6,835,995 | B2 | 12/2004 | Li |
| 6,846,745 | B1 | 1/2005 | Papasouliotis et al. |
| 6,852,550 | B2 | 2/2005 | Tuttle et al. |
| 6,858,153 | B2 | 2/2005 | Bjorkman et al. |
| 6,861,097 | B1 | 3/2005 | Goosey et al. |
| 6,861,332 | B2 | 3/2005 | Park et al. |
| 6,869,880 | B2 | 3/2005 | Krishnaraj et al. |
| 6,875,280 | B2 | 4/2005 | Ikeda et al. |
| 6,878,206 | B2 | 4/2005 | Tzu et al. |
| 6,879,981 | B2 | 4/2005 | Rothschild et al. |
| 6,886,491 | B2 | 5/2005 | Kim et al. |
| 6,892,669 | B2 | 5/2005 | Xu et al. |
| 6,893,967 | B1 | 5/2005 | Wright et al. |
| 6,897,532 | B1 | 5/2005 | Schwarz et al. |
| 6,903,511 | B2 | 6/2005 | Chistyakov |
| 6,908,862 | B2 | 6/2005 | Li et al. |
| 6,911,112 | B2 | 6/2005 | An |
| 6,911,401 | B2 | 6/2005 | Khandan et al. |
| 6,921,556 | B2 | 7/2005 | Shimizu et al. |
| 6,924,191 | B2 | 8/2005 | Liu et al. |
| 6,930,047 | B2 | 8/2005 | Yamazaki |
| 6,942,753 | B2 | 9/2005 | Choi et al. |
| 6,946,033 | B2 | 9/2005 | Tsuei et al. |
| 6,951,821 | B2 | 10/2005 | Hamelin et al. |
| 6,958,175 | B2 | 10/2005 | Sakamoto et al. |
| 6,958,286 | B2 | 10/2005 | Chen et al. |
| 6,995,073 | B2 | 2/2006 | Liou |
| 7,017,269 | B2 | 3/2006 | White et al. |
| 7,018,941 | B2 | 3/2006 | Cui et al. |
| 7,030,034 | B2 | 4/2006 | Fucsko et al. |
| 7,049,200 | B2 | 5/2006 | Arghavani et al. |
| 7,071,532 | B2 | 7/2006 | Geffken et al. |

(56) References Cited

U.S. PATENT DOCUMENTS

| | | |
|---|---|---|
| 7,084,070 B1 | 8/2006 | Lee et al. |
| 7,115,525 B2 | 10/2006 | Abatchev et al. |
| 7,122,949 B2 | 10/2006 | Strikovski |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,252,716 B2 | 8/2007 | Kim et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,341,633 B2 | 3/2008 | Lubomirsky et al. |
| 7,365,016 B2 | 4/2008 | Ouellet et al. |
| 7,396,480 B2 | 7/2008 | Kao et al. |
| 7,416,989 B1 | 8/2008 | Liu et al. |
| 7,465,358 B2 | 12/2008 | Weidman et al. |
| 7,468,319 B2 | 12/2008 | Lee |
| 7,484,473 B2 | 2/2009 | Keller et al. |
| 7,488,688 B2 | 2/2009 | Seung-Pil et al. |
| 7,494,545 B2 | 2/2009 | Lam et al. |
| 7,500,445 B2 | 3/2009 | Zhao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,628,897 B2 | 12/2009 | Mungekar et al. |
| 7,682,518 B2 | 3/2010 | Chandrachood et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,785,672 B2 | 8/2010 | Choi et al. |
| 7,790,634 B2 | 9/2010 | Munro et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,915,139 B1 | 3/2011 | Lang et al. |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,981,806 B2 | 7/2011 | Jung |
| 7,989,365 B2 | 8/2011 | Park et al. |
| 8,008,166 B2 | 8/2011 | Sanchez et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,119,530 B2 | 2/2012 | Hori et al. |
| 8,133,349 B1 | 3/2012 | Panagopoulos |
| 8,187,486 B1 | 5/2012 | Liu et al. |
| 8,211,808 B2 | 7/2012 | Sapre et al. |
| 8,298,627 B2 | 10/2012 | Minami et al. |
| 8,309,440 B2 | 11/2012 | Sanchez et al. |
| 8,313,610 B2 | 11/2012 | Dhindsa |
| 8,328,939 B2 | 12/2012 | Choi et al. |
| 8,368,308 B2 | 2/2013 | Banna et al. |
| 8,427,067 B2 | 4/2013 | Espiau et al. |
| 8,435,902 B2 | 5/2013 | Tang et al. |
| 8,475,674 B2 | 7/2013 | Thadani et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,623,148 B2 | 1/2014 | Mitchell et al. |
| 8,623,471 B2 | 1/2014 | Tyler et al. |
| 8,642,481 B2 | 2/2014 | Wang et al. |
| 8,679,982 B2 | 3/2014 | Wang et al. |
| 8,679,983 B2 | 3/2014 | Wang et al. |
| 8,741,778 B2 | 6/2014 | Yang et al. |
| 8,747,680 B1 | 6/2014 | Deshpande |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,808,563 B2 | 8/2014 | Wang et al. |
| 8,846,163 B2 | 9/2014 | Kao et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,951,429 B1 * | 2/2015 | Liu et al. ................. 216/76 |
| 8,956,980 B1 | 2/2015 | Chen et al. |
| 8,969,212 B2 | 3/2015 | Ren et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,733 B2 | 3/2015 | Sorensen et al. |
| 8,999,656 B2 | 4/2015 | Zhang et al. |
| 8,999,839 B2 | 4/2015 | Su et al. |
| 8,999,856 B2 | 4/2015 | Zhang |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,072,158 B2 | 6/2015 | Ikeda et al. |
| 9,093,371 B2 | 7/2015 | Wang et al. |
| 9,093,390 B2 | 7/2015 | Wang et al. |
| 9,111,877 B2 | 8/2015 | Chen et al. |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,159,606 B1 | 10/2015 | Purayath et al. |
| 9,165,786 B1 | 10/2015 | Purayath et al. |
| 9,184,055 B2 | 11/2015 | Wang et al. |
| 9,190,293 B2 | 11/2015 | Wang et al. |
| 9,209,012 B2 | 12/2015 | Chen et al. |
| 2001/0008803 A1 | 7/2001 | Takamatsu et al. |
| 2001/0015261 A1 | 8/2001 | Kobayashi et al. |
| 2001/0028093 A1 | 10/2001 | Yamazaki et al. |
| 2001/0028922 A1 | 10/2001 | Sandhu |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0036706 A1 | 11/2001 | Kitamura |
| 2001/0041444 A1 | 11/2001 | Shields et al. |
| 2001/0047760 A1 | 12/2001 | Mosiehl |
| 2001/0053585 A1 | 12/2001 | Kikuchi et al. |
| 2001/0054381 A1 | 12/2001 | Umotoy et al. |
| 2001/0055842 A1 | 12/2001 | Uh et al. |
| 2002/0000202 A1 | 1/2002 | Yuda et al. |
| 2002/0011210 A1 | 1/2002 | Satoh et al. |
| 2002/0016080 A1 | 2/2002 | Khan et al. |
| 2002/0016085 A1 | 2/2002 | Huang et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0090781 A1 | 7/2002 | Skotnicki et al. |
| 2002/0098681 A1 | 7/2002 | Hu et al. |
| 2002/0106845 A1 | 8/2002 | Chao et al. |
| 2002/0124867 A1 | 9/2002 | Kim et al. |
| 2002/0129769 A1 | 9/2002 | Kim et al. |
| 2002/0153808 A1 | 10/2002 | Skotnicki et al. |

(56) References Cited

U.S. PATENT DOCUMENTS

| | | |
|---|---|---|
| 2002/0164885 A1 | 11/2002 | Lill et al. |
| 2002/0177322 A1 | 11/2002 | Li et al. |
| 2002/0187280 A1 | 12/2002 | Johnson et al. |
| 2002/0187655 A1 | 12/2002 | Tan et al. |
| 2003/0003757 A1 | 1/2003 | Naltan et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0029566 A1 | 2/2003 | Roth |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0124465 A1 | 7/2003 | Lee et al. |
| 2003/0124842 A1 | 7/2003 | Hytros et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0159307 A1 | 8/2003 | Sago et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0205329 A1 | 11/2003 | Gujer et al. |
| 2003/0215963 A1 | 11/2003 | AmRhein et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0020801 A1 | 2/2004 | Zhao et al. |
| 2004/0026371 A1 | 2/2004 | Nguyen et al. |
| 2004/0033678 A1 | 2/2004 | Arghavani et al. |
| 2004/0050328 A1 | 3/2004 | Kumagai et al. |
| 2004/0058293 A1 | 3/2004 | Nguyen et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0092063 A1 | 5/2004 | Okumura |
| 2004/0099378 A1 | 5/2004 | Kim et al. |
| 2004/0101667 A1 | 5/2004 | O'Loughlin et al. |
| 2004/0115876 A1 | 6/2004 | Goundar et al. |
| 2004/0129671 A1 | 7/2004 | Ji et al. |
| 2004/0137161 A1 | 7/2004 | Segawa et al. |
| 2004/0144490 A1 | 7/2004 | Zhao et al. |
| 2004/0147126 A1 | 7/2004 | Yamashita et al. |
| 2004/0152342 A1 | 8/2004 | Li |
| 2004/0154535 A1 | 8/2004 | Chen et al. |
| 2004/0157444 A1 | 8/2004 | Chiu |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0211357 A1 | 10/2004 | Gadgil et al. |
| 2004/0219737 A1 | 11/2004 | Quon |
| 2004/0219789 A1 | 11/2004 | Wood et al. |
| 2004/0263827 A1 | 12/2004 | Xu |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0073051 A1 | 4/2005 | Yamamoto et al. |
| 2005/0079706 A1 | 4/2005 | Kumar et al. |
| 2005/0090120 A1 | 4/2005 | Hasegawa et al. |
| 2005/0098111 A1 | 5/2005 | Shimizu et al. |
| 2005/0112876 A1 | 5/2005 | Wu |
| 2005/0112901 A1 | 5/2005 | Ji et al. |
| 2005/0164479 A1* | 7/2005 | Perng et al. .................. 438/591 |
| 2005/0167394 A1 | 8/2005 | Liu et al. |
| 2005/0181588 A1 | 8/2005 | Kim |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0214477 A1 | 9/2005 | Hanawa et al. |
| 2005/0218507 A1 | 10/2005 | Kao et al. |
| 2005/0221552 A1 | 10/2005 | Kao et at. |
| 2005/0230350 A1 | 10/2005 | Kao et al. |
| 2005/0236694 A1 | 10/2005 | Wu et al. |
| 2005/0251990 A1 | 11/2005 | Choi et al. |
| 2005/0266622 A1 | 12/2005 | Arghavani et al. |
| 2005/0266691 A1 | 12/2005 | Gu et al. |
| 2005/0269030 A1 | 12/2005 | Kent et al. |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0006057 A1 | 1/2006 | Laermer |
| 2006/0011298 A1 | 1/2006 | Lim et al. |
| 2006/0016783 A1 | 1/2006 | Wu et al. |
| 2006/0019456 A1 | 1/2006 | Bu et at. |
| 2006/0019486 A1 | 1/2006 | Yu et al. |
| 2006/0021574 A1 | 2/2006 | Armour et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0060942 A1 | 3/2006 | Minixhofer et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0121724 A1 | 6/2006 | Yue et al. |
| 2006/0124242 A1 | 6/2006 | Kanarik et al. |
| 2006/0130971 A1 | 6/2006 | Chang et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0178008 A1 | 8/2006 | Yeh et al. |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0210723 A1 | 9/2006 | Ishizaka |
| 2006/0216878 A1 | 9/2006 | Lee |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0246717 A1 | 11/2006 | Wang |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |

(56) References Cited

U.S. PATENT DOCUMENTS

| | | |
|---|---|---|
| 2006/0261490 A1 | 11/2006 | Su et al. |
| 2006/0264043 A1 | 11/2006 | Stewart et al. |
| 2006/0266288 A1 | 11/2006 | Choi |
| 2007/0048977 A1 | 3/2007 | Lee et al. |
| 2007/0062453 A1 | 3/2007 | Ishikawa |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0099428 A1 | 5/2007 | Shamiryan et al. |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0131274 A1 | 6/2007 | Stollwerck et al. |
| 2007/0154838 A1 | 7/2007 | Lee |
| 2007/0163440 A1 | 7/2007 | Kim et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0212288 A1 | 9/2007 | Holst |
| 2007/0235134 A1 | 10/2007 | Iimuro |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0277734 A1 | 12/2007 | Lubomirsky et al. |
| 2007/0281106 A1 | 12/2007 | Lubomirksy et al. |
| 2007/0287292 A1 | 12/2007 | Li et al. |
| 2008/0020570 A1 | 1/2008 | Naik |
| 2008/0044990 A1 | 2/2008 | Lee |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0102570 A1 | 5/2008 | Fisher et al. |
| 2008/0102640 A1 | 5/2008 | Hassan et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0142483 A1 | 6/2008 | Hua et al. |
| 2008/0153306 A1 | 6/2008 | Cho et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0171407 A1 | 7/2008 | Nakabayashi et al. |
| 2008/0173906 A1 | 7/2008 | Zhu |
| 2008/0182381 A1 | 7/2008 | Kiyotoshi |
| 2008/0182383 A1 | 7/2008 | Lee et al. |
| 2008/0202892 A1 | 8/2008 | Smith et al. |
| 2008/0230519 A1 | 9/2008 | Takahashi |
| 2008/0233709 A1 | 9/2008 | Conti et al. |
| 2008/0254635 A1 | 10/2008 | Benzel et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2009/0001480 A1 | 1/2009 | Cheng |
| 2009/0004849 A1 | 1/2009 | Eun |
| 2009/0017227 A1 | 1/2009 | Fu et al. |
| 2009/0045167 A1 | 2/2009 | Maruyama |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087979 A1 | 4/2009 | Raghuram |
| 2009/0095621 A1 | 4/2009 | Kao et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0120464 A1 | 5/2009 | Rasheed et al. |
| 2009/0170221 A1 | 7/2009 | Jacques et al. |
| 2009/0179300 A1 | 7/2009 | Arai |
| 2009/0189246 A1 | 7/2009 | Wu et al. |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0294898 A1 | 12/2009 | Feustel et al. |
| 2010/0003824 A1 | 1/2010 | Kadkhodayan et al. |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0075503 A1 | 3/2010 | Bencher |
| 2010/0093151 A1 | 4/2010 | Arghavani et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0130001 A1 | 5/2010 | Noguchi |
| 2010/0144140 A1 | 6/2010 | Chandrashekar et al. |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0207205 A1 | 8/2010 | Grebs et al. |
| 2010/0240205 A1 | 9/2010 | Son |
| 2010/0294199 A1 | 11/2010 | Tran et al. |
| 2010/0330814 A1 | 12/2010 | Yokota et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0045676 A1 | 2/2011 | Park |
| 2011/0053380 A1 | 3/2011 | Sapre et al. |
| 2011/0061810 A1 | 3/2011 | Ganguly et al. |
| 2011/0081782 A1 | 4/2011 | Liang et al. |
| 2011/0100489 A1 | 5/2011 | Orito |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0143542 A1 | 6/2011 | Feurprier et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165771 A1 | 7/2011 | Ring et al. |
| 2011/0180847 A1 | 7/2011 | Ikeda et al. |
| 2011/0195575 A1 | 8/2011 | Wang |
| 2011/0217851 A1 | 9/2011 | Liang et al. |
| 2011/0226734 A1 | 9/2011 | Sumiya et al. |
| 2011/0230052 A1 | 9/2011 | Tang et al. |
| 2011/0232737 A1 | 9/2011 | Ruletzki et al. |
| 2011/0266252 A1 | 11/2011 | Thadani et al. |
| 2011/0266682 A1 | 11/2011 | Edelstein et al. |
| 2011/0294300 A1 | 12/2011 | Zhang et al. |
| 2011/0298061 A1 | 12/2011 | Siddiqui et al. |

(56) References Cited

U.S. PATENT DOCUMENTS

| | | |
|---|---|---|
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0052683 A1 | 3/2012 | Kim et al. |
| 2012/0068242 A1 | 3/2012 | Shin et al. |
| 2012/0103518 A1 | 5/2012 | Kakimoto |
| 2012/0129354 A1 | 5/2012 | Luong |
| 2012/0135576 A1 | 5/2012 | Lee et al. |
| 2012/0161405 A1 | 6/2012 | Mohn et al. |
| 2012/0164839 A1 | 6/2012 | Nishimura |
| 2012/0180954 A1 | 7/2012 | Yang et al. |
| 2012/0196447 A1 | 8/2012 | Yang et al. |
| 2012/0211462 A1* | 8/2012 | Zhang et al. ............ 216/13 |
| 2012/0223048 A1 | 9/2012 | Paranjpe et al. |
| 2012/0225557 A1 | 9/2012 | Serry et al. |
| 2012/0228642 A1* | 9/2012 | Aube et al. ............. 257/79 |
| 2012/0238102 A1 | 9/2012 | Zhang et al. |
| 2012/0238103 A1* | 9/2012 | Zhang et al. ........... 438/720 |
| 2012/0247670 A1 | 10/2012 | Dobashi et al. |
| 2012/0267346 A1 | 10/2012 | Kao et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0005103 A1 | 1/2013 | Liu et al. |
| 2013/0005140 A1 | 1/2013 | Jeng et al. |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0065398 A1 | 3/2013 | Ohsawa et al. |
| 2013/0082197 A1 | 4/2013 | Yang et al. |
| 2013/0089988 A1* | 4/2013 | Wang et al. ............ 438/719 |
| 2013/0119483 A1 | 5/2013 | Alptekin et al. |
| 2013/0130507 A1 | 5/2013 | Wang et al. |
| 2013/0187220 A1 | 7/2013 | Surthi |
| 2013/0193108 A1 | 8/2013 | Zheng |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0284369 A1 | 10/2013 | Kobayashi et al. |
| 2013/0284370 A1 | 10/2013 | Kobayashi et al. |
| 2013/0298942 A1 | 11/2013 | Ren et al. |
| 2013/0302980 A1 | 11/2013 | Chandrashekar et al. |
| 2013/0337655 A1 | 12/2013 | Lee et al. |
| 2014/0004708 A1 | 1/2014 | Thedjoisworo |
| 2014/0021673 A1 | 1/2014 | Chen et al. |
| 2014/0057447 A1 | 2/2014 | Yang et al. |
| 2014/0065842 A1 | 3/2014 | Anthis et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0134847 A1 | 5/2014 | Seya |
| 2014/0141621 A1 | 5/2014 | Ren et al. |
| 2014/0166617 A1 | 6/2014 | Chen |
| 2014/0166618 A1 | 6/2014 | Tadigadapa et al. |
| 2014/0190410 A1 | 7/2014 | Kim |
| 2014/0199851 A1 | 7/2014 | Nemani et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248780 A1 | 9/2014 | Ingle et al. |
| 2014/0256131 A1* | 9/2014 | Wang et al. ............ 438/676 |
| 2014/0262031 A1 | 9/2014 | Belostotskiy et al. |
| 2014/0262038 A1 | 9/2014 | Wang et al. |
| 2014/0263272 A1 | 9/2014 | Duan et al. |
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0060265 A1 | 3/2015 | Cho et al. |
| 2015/0079797 A1 | 3/2015 | Chen et al. |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132968 A1 | 5/2015 | Ren et al. |
| 2015/0155177 A1 | 6/2015 | Zhang et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214337 A1 | 7/2015 | Ko et al. |
| 2015/0221541 A1 | 8/2015 | Nemani et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0270140 A1 | 9/2015 | Gupta et al. |
| 2015/0275375 A1 | 10/2015 | Kim et al. |
| 2015/0294980 A1 | 10/2015 | Lee et al. |
| 2015/0332930 A1 | 11/2015 | Wang et al. |
| 2015/0357205 A1 | 12/2015 | Wang et al. |

FOREIGN PATENT DOCUMENTS

| | | |
|---|---|---|
| KR | 10-2011-0086540 A | 7/2011 |
| TW | 201430944 | 8/2014 |
| WO | 2014/099205 | 6/2014 |

OTHER PUBLICATIONS

International Search Report and Written Opinion of PCT/US2013/070600, mailed on Feb. 26, 2014, 15 pages.

* cited by examiner

NON-LOCAL PLASMA OXIDE ETCH

CROSS-REFERENCES TO RELATED APPLICATIONS

This application is a continuation of U.S. patent application Ser. No. 13/790,668, filed Mar. 8, 2013, which claims the benefit of U.S. Prov. Pat. App. No. 61/738,855 filed Dec. 18, 2012, and titled "NON-LOCAL PLASMA OXIDE ETCH," both of which are hereby incorporated by reference in their entirety for all purposes.

BACKGROUND OF THE INVENTION

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective to the first material. As a result of the diversity of materials, circuits and processes, etch processes have been developed with a selectivity towards a variety of materials. However, there are few options for selectively etching silicon nitride faster than silicon.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma excitation of ammonia and nitrogen trifluoride enables silicon oxide to be selectively removed from a patterned substrate when the plasma effluents are flowed into the substrate processing region. Remote plasma etch processes have recently been developed to selectively remove a variety of dielectrics relative to one another. However, fewer dry-etch processes have been developed to selectively remove metals and/or their oxidation.

Methods are needed to selectively etch oxide layers from metal surfaces using dry etch processes.

BRIEF SUMMARY OF THE INVENTION

A method of etching exposed titanium oxide on heterogeneous structures is described and includes a remote plasma etch formed from a fluorine-containing precursor. Plasma effluents from the remote plasma are flowed into a substrate processing region where the plasma effluents may combine with a nitrogen-containing precursor such as an amine (N:) containing precursor. Reactants thereby produced etch the patterned heterogeneous structures with high titanium oxide selectivity while the substrate is at elevated temperature. Titanium oxide etch may alternatively involve supplying a fluorine-containing precursor and a source of nitrogen-and-hydrogen-containing precursor to the remote plasma. The methods may be used to remove titanium oxide while removing little or no low-K dielectric, polysilicon, silicon nitride or titanium nitride.

Embodiments of the invention include methods of etching a substrate in a substrate processing region of a substrate processing chamber. The substrate has an exposed titanium oxide region. The methods include flowing a fluorine-containing precursor into a remote plasma region fluidly coupled to the substrate processing region while forming a remote plasma in the remote plasma region to produce plasma effluents. The methods further include flowing a nitrogen-and-hydrogen-containing precursor into the substrate processing region without first passing the nitrogen-and-hydrogen-containing precursor through the remote plasma region. The methods further include etching the exposed titanium oxide region with the combination of the plasma effluents and the nitrogen-and-hydrogen-containing precursor in the substrate processing region.

Embodiments of the invention include methods of etching a substrate in a substrate processing region of a substrate processing chamber. The substrate has an exposed titanium oxide region. The methods include flowing ammonia and a fluorine-containing precursor into a remote plasma region fluidly coupled to the substrate processing region while forming a remote plasma in the remote plasma region to produce plasma effluents. The methods further include etching the exposed titanium oxide region with the plasma effluents in the substrate processing region.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

A method of etching exposed titanium oxide on heterogeneous structures is described and includes a remote plasma etch formed from a fluorine-containing precursor. Plasma effluents from the remote plasma are flowed into a substrate processing region where the plasma effluents may combine with a nitrogen-containing precursor such as an amine (N:) containing precursor. Reactants thereby produced etch the patterned heterogeneous structures with high titanium oxide selectivity while the substrate is at elevated temperature. Titanium oxide etch may alternatively involve supplying a fluorine-containing precursor and a source of nitrogen-and-hydrogen-containing precursor to the remote plasma. The methods may be used to remove titanium oxide while removing little or no low-K dielectric, polysilicon, silicon nitride or titanium nitride.

Figure 1:
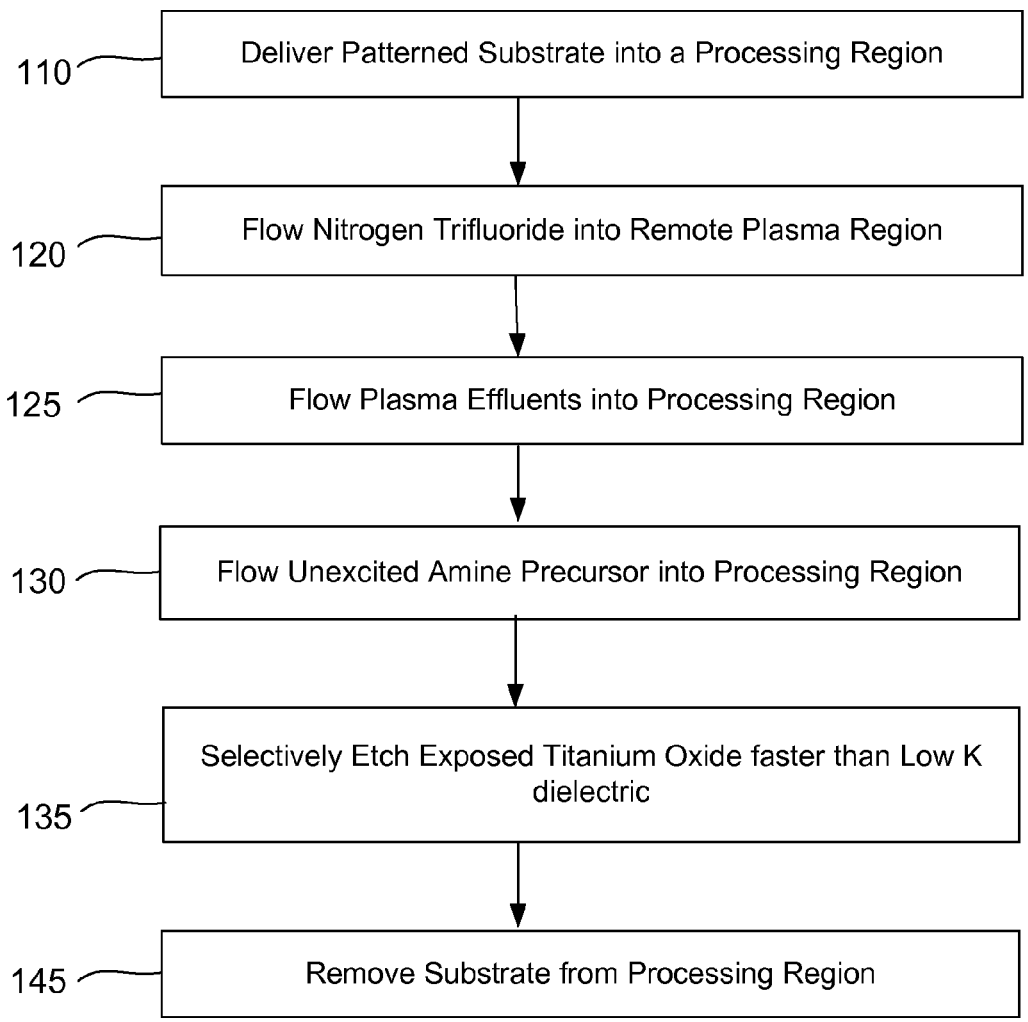
FIG. 1 is a flow chart of a titanium oxide selective etch process according to disclosed embodiments.

In order to better understand and appreciate the invention, reference is now made to FIG. 1 which is a flow chart of a titanium oxide selective etch process according to disclosed embodiments. Prior to the first operation, the substrate is patterned leaving exposed regions of titanium oxide and regions of low-K dielectric which may be covered. The patterned substrate is then delivered into a substrate processing region (operation 110). A flow of nitrogen trifluoride is initiated into a plasma region separate from the processing region (operation 120). Other sources of fluorine may be used to augment or replace the nitrogen trifluoride. In general, a fluorine-containing precursor is flowed into the plasma region and the fluorine-containing precursor comprises at least one precursor selected from the group consisting of atomic fluorine, diatomic fluorine, nitrogen trifluoride, carbon tetrafluoride, hydrogen fluoride and xenon difluoride. The separate plasma region may be referred to as a remote plasma region herein and may be within a distinct module from the processing chamber or a compartment within the processing chamber. The plasma effluents formed in the remote plasma region are then flowed into the substrate processing region (operation 125). At this point, the gas phase etch would have little selectivity towards titanium oxide and would have limited utility. However, a nitrogen-and-hydrogen-containing precursor is simultaneously flowed into the substrate processing region (operation 130) to react with the plasma effluents. The nitrogen-and-hydrogen-containing precursor is not passed through the remote plasma region (or any plasma formed outside the substrate processing region for that matter) and therefore is only excited by interaction with the plasma effluents.

The flow rate of the nitrogen-and-hydrogen-containing precursor may be between 0.5 and about 10 times the flow rate of the fluorine-containing precursor in disclosed embodiments. The flow rate ratio (nitrogen-and-hydrogen-containing precursor:fluorine-containing precursor) may preferably be between 1:1 and 5:1 or between 2:1 and 3:1 in embodiments of the invention. Nitrogen trifluoride (or fluorine-containing precursors in general) may be flowed into the remote plasma region at rates greater than or about 25 sccm, greater than or about 40 sccm, greater than or about 60 sccm or greater than or about 75 sccm in disclosed embodiments.

The patterned substrate is selectively etched (operation 135) such that the titanium oxide is removed at a significantly higher rate than the low-K dielectric. The reactive chemical species are removed from the substrate processing region and then the substrate is removed from the processing region (operation 145). Using the gas phase dry etch processes described herein, the inventors have established that etch selectivities of over 40:1 (titanium oxide etch rate:low-K dielectric etch rate) are possible. The titanium oxide etch rate exceeds the low-K dielectric etch rate by a multiplicative factor of about 50 or more, about 100 or more, about 150 or more, about 200 or more, or about 300 or more, in embodiments of the invention. Low-K dielectric materials may have a dielectric constant less than 3.5, less than 3.3, less than 3.1, or less than 3.0 in disclosed embodiments. Low-K dielectric materials may comprise or consist of silicon, carbon, oxygen and hydrogen.

The gas phase dry etches described herein have also been discovered to increase etch selectivity of titanium oxide relative to silicon (including polysilicon). Using the gas phase dry etch processes described herein, the inventors have established that etch selectivities of over 50:1 (SiO etch rate:Si etch rate) are possible. The titanium oxide etch rate exceeds the (poly)silicon etch rate by a multiplicative factor of about 50 or more, 100 or more, about 150 or more, about 200 or more, or about 300 or more, in embodiments of the invention.

The gas phase dry etches described herein have also been discovered to increase etch selectivity of titanium oxide relative to silicon nitride (or titanium nitride). Using the gas phase dry etch processes described herein, the inventors have established that etch selectivities of over 50:1 TiO:SiN (or TiO:TiN) are possible. The titanium oxide etch rate exceeds the silicon nitride (or titanium nitride) etch rate by a multiplicative factor of about 50 or more, 100 or more, about 150 or more, about 200 or more, or about 300 or more, in embodiments of the invention.

The nitrogen-and-hydrogen-containing precursor may consist of nitrogen and hydrogen. The nitrogen-and-hydrogen-containing precursor may comprise an amine group, in embodiments of the invention, and may be referred to as an amine-containing precursor. An amine group is defined as having a nitrogen possessing a lone pair of electrons (denoted canonically N:). Therefore nitrogen-and-hydrogen-containing precursors include ammonia, methyl amine, ethylamine, diethylamine, methyl ethyl diamine and the like. Hydrogen-containing precursors may be simultaneously combined with the fluorine-containing precursor in the remote plasma region or prior to entry into the remote plasma region.

Figure 2:
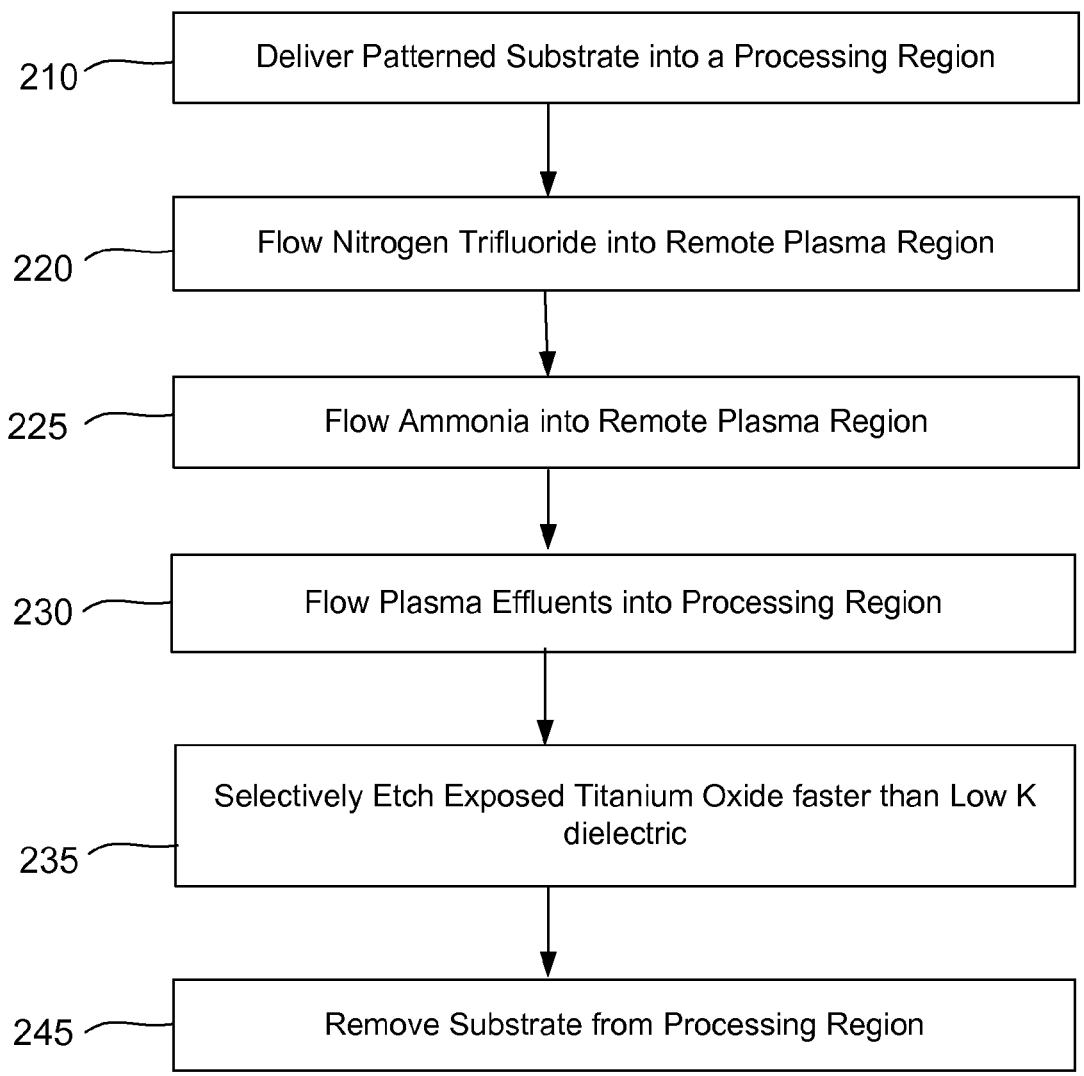
FIG. 2 is a flow chart of a titanium oxide selective etch process according to disclosed embodiments.

Reference is now made to FIG. 2 which is a flow chart of a titanium oxide selective etch process according to alternative disclosed embodiments. Prior to the first operation, the substrate is again patterned leaving exposed regions of titanium oxide and regions of low-K dielectric which may or may not be exposed. The patterned substrate is then delivered into a substrate processing region (operation 210). A flow of nitrogen trifluoride is again initiated into a plasma region separate from the processing region (operation 220). The alternative sources of fluorine may again be used to augment or replace the nitrogen trifluoride. The separate plasma region may be referred to as a remote plasma region, as before, and may be within a distinct module from the processing chamber or a compartment within the processing chamber. Ammonia is also flowed into the remote plasma region (operation 225). This process is similar to the Siconi process with the exception of the exposed substrate materials and some deviations of process parameters as outlined herein. The plasma effluents formed in the remote plasma region are then flowed into the substrate processing region (operation 230).

The patterned substrate is selectively etched (operation 235) such that the titanium oxide is removed at a significantly higher rate than the low-K dielectric. The reactive chemical species are removed from the substrate processing region and then the substrate is removed from the processing region (operation 245). The selectivity embodiments and materials outlined with reference to FIG. 1 also apply to the process of FIG. 2. Substrate temperatures and process pressures also have been found to lie within the same embodiments which will be described shortly. On the other hand, the flow rate ratios may differ as follows. The flow rate of the ammonia may be between 1 and about 20 times the flow rate of the fluorine-containing precursor in disclosed embodiments. The flow rate ratio (ammonia:fluorine-containing precursor) may preferably be between 1:1 and 10:1 or between 3:1 and 7:1 in embodiments of the invention. The absolute flow rate of the fluorine-containing precursor lie within the embodiments of the earlier example.

Without wishing to bind the coverage of the claims to theoretical mechanisms which may or may not be entirely correct, some discussion of possible mechanisms may prove beneficial. Radical-fluorine precursors are produced by delivering a fluorine-containing precursor into the remote plasma region. Applicants suppose that a concentration of fluorine ions and atoms is produced and delivered into the substrate processing region. Ammonia ($NH_3$) in the plasma or unexcited amine-containing precursors may react with the fluorine to produce less reactive species such as ammonium bifluoride ($NH_4HF_2$) which travel into the substrate processing region. The delivery of hydrogen and fluorine as described herein allows the formation of solid byproducts (salts) of $(NH_4)_2 TiF_6$ at relatively low substrate temperatures (<70° C.). At higher substrate temperatures, the inventors suppose that the solid by-products are still formed on the exposed titanium oxide (TiO) surfaces but are concurrently removed during the etch process by maintaining the relatively high substrate temperature as outlined herein. By limiting the reactivity of the incoming chemical species, the inventors have found a way to remove titanium oxide while retaining silicon, titanium nitride, low-K dielectric material and silicon nitride on the patterned substrate surface. The selectivity combined with the lack of solid byproducts, make these etch processes well suited for removing titanium oxide structures from above delicate low-K dielectric materials while inducing little deformation in the remaining delicate structures.

During the etch processes described herein, the temperature of the substrate may be about 110° C. or more and about 400° C. or less, in disclosed embodiments. The temperature of the substrate may be above or about 70° C., above or about 90° C., above or about 110° C., above or about 130° C., above or about 150° C. or above or about 170° C. in disclosed embodiments. The temperature of the substrate may be below or about 400° C., below or about 350° C., below or about 325° C. or below or about 300° C. in disclosed embodiments. Any of the upper limits can be combined with any of these lower limits to form additional embodiments of the invention. In a preferred embodiment, the temperature of the substrate may be between 200° C. and 300° C. during the etching operation in embodiments of the invention.

The inventors have found that exposed interior components should be kept at elevated temperatures in order to avoid trapping the desirable etching agents (hypothesized to include ammonium bifluoride). Interior components include surfaces which come in contact with the etching agents which are formed in either configuration (see FIGS. 1-2 and associated discussion). Possible interior components will be discussed in greater detail in the exemplary equipment section, but may include a showerhead separating the substrate processing region from the remote plasma region. Interior components may include chamber walls, faceplates and dedicated ion suppression elements. Interior components may be kept above or about 70° C., above or about 90° C., above or about 110° C. or above or about 130° C. in disclosed embodiments during the etching operation. Maintaining an elevated temperature of between, for example, 130° C. and 170° C., has been determined to increase the etch rate of the substrate by ensuring adequate flow of neutral active etching species to the titanium oxide substrate surface.

A dedicated ion suppression element may be included in the remote plasma region in order to further control the ion density entering the substrate processing region. Reducing the ion concentration is believed to enable the high titanium oxide selectivities outlined earlier. The ion suppression element functions to reduce or eliminate ionically charged species traveling from the plasma generation region to the substrate. Uncharged neutral and radical species may pass through the openings in the ion suppressor to react at the substrate.

The pressure in the substrate processing region may be above or about 0.1 Torr and less than or about 50 Torr, in disclosed embodiments, during the etching operation. The pressure may be above or about 0.1 Torr, above or about 0.2 Torr, above or about 0.5 Torr or above or about 1 Torr in disclosed embodiments. The pressure may be below or about 50 Torr, below or about 25 Torr, below or about 15 Torr or below or about 10 Torr in disclosed embodiments. Any of the upper limits can be combined with any of these lower limits to form additional embodiments of the invention. Additional titanium oxide selective etch process parameters are disclosed in the course of describing an exemplary processing chamber and system.

Exemplary Processing System

Processing chambers that may implement embodiments of the present invention may be included within processing platforms such as the CENTURA® and PRODUCER® systems, available from Applied Materials, Inc. of Santa Clara, Calif. Examples of substrate processing chambers that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 3A:
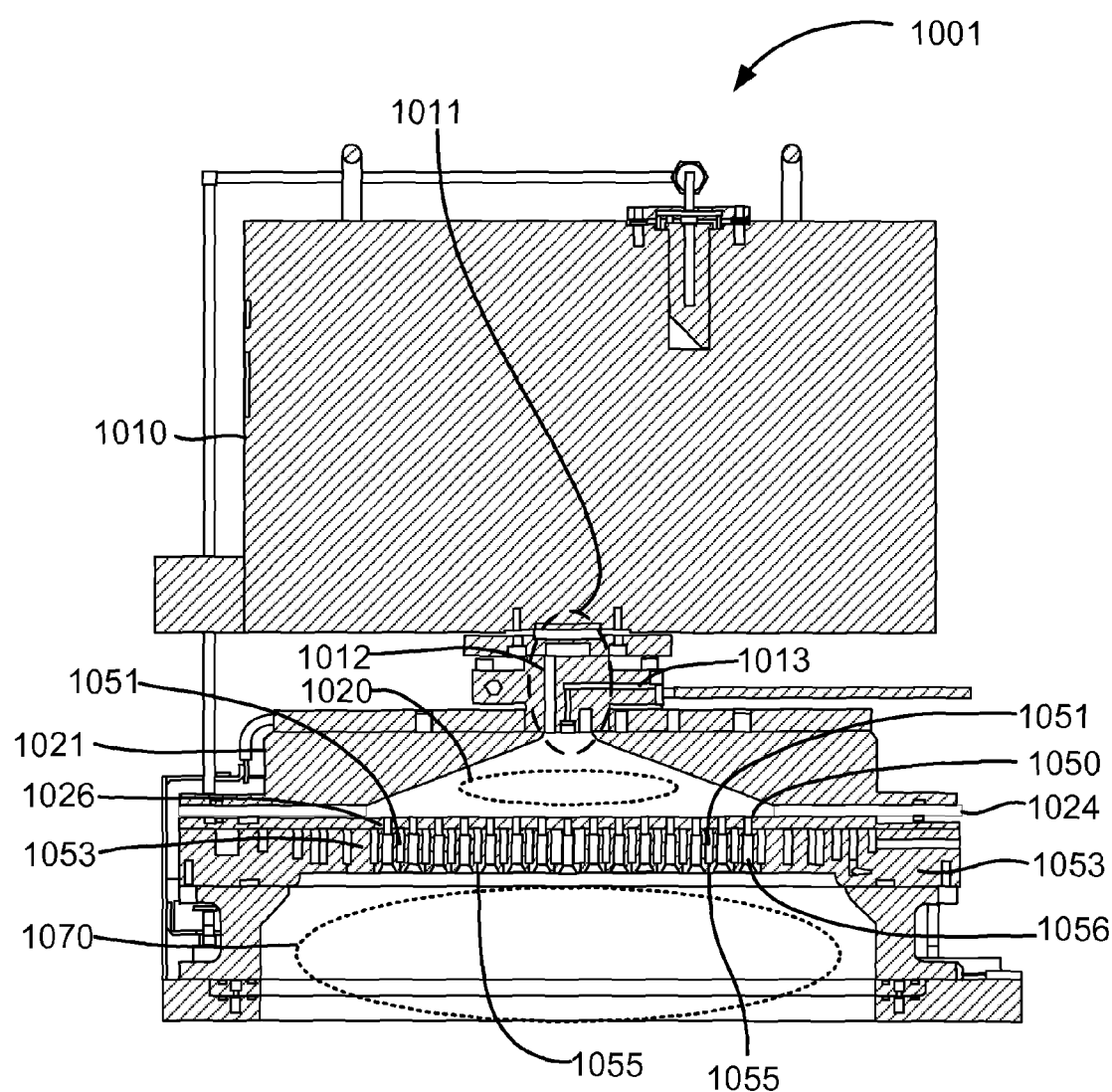
FIG. 3A shows a substrate processing chamber according to embodiments of the invention.

FIG. 3A is a substrate processing chamber 1001 according to disclosed embodiments. A remote plasma system (RPS 1010) may process the fluorine-containing precursor which then travels through a gas inlet assembly 1011. Two distinct gas supply channels are visible within the gas inlet assembly 1011. A first channel 1012 carries a gas that passes through the remote plasma system RPS 1010, while a second channel 1013 bypasses the RPS 1010. Either channel may be used for the fluorine-containing precursor, in embodiments. On the other hand, the first channel 1002 may be used for the process gas and the second channel 1013 may be used for a treatment gas. The lid 1021 (e.g. a conducting top portion) and a perforated partition (showerhead 1053) are shown with an insulating ring 1024 in between, which allows an AC potential to be applied to the lid 1021 relative to showerhead 1053. The AC potential strikes a plasma in chamber plasma region 1020. The process gas may travel through first channel 1012 into chamber plasma region 1020 and may be excited by a plasma in chamber plasma region 1020 alone or in combination with RPS 1010. If the process gas (the fluorine-containing precursor) flows through second channel 1013, then only the chamber plasma region 1020 is used for excitation. The combination of chamber plasma region 1020 and/or RPS 1010 may be referred to as a remote plasma system herein. The perforated partition (also referred to as a showerhead) 1053 separates chamber plasma region 1020 from a substrate processing region 1070 beneath showerhead 1053. Showerhead 1053 allows a plasma present in chamber plasma region 1020 to avoid directly exciting gases in substrate processing region 1070, while still allowing excited species to travel from chamber plasma region 1020 into substrate processing region 1070.

Showerhead 1053 is positioned between chamber plasma region 1020 and substrate processing region 1070 and allows plasma effluents (excited derivatives of precursors or other gases) created within RPS 1010 and/or chamber plasma region 1020 to pass through a plurality of through-holes 1056 that traverse the thickness of the plate. The showerhead 1053 also has one or more hollow volumes 1051 which can be filled with a precursor in the form of a vapor or gas (such as an amine-containing precursor) and pass through small holes 1055 into substrate processing region 1070 but not directly into chamber plasma region 1020. Showerhead 1053 is thicker than the length of the smallest diameter 1050 of the through-holes 1056 in this disclosed embodiment. In order to maintain a significant concentration of excited species penetrating from chamber plasma region 1020 to substrate processing region 1070, the length 1026 of the smallest diameter 1050 of the through-holes may be restricted by forming larger diameter portions of through-holes 1056 part way through the showerhead 1053. The length of the smallest diameter 1050 of the through-holes 1056 may be the same order of magnitude as the smallest diameter of the through-holes 1056 or less in disclosed embodiments. In this way a fluorine-containing precursor may be flowed through through-holes 1056 in a dual-zone showerhead and a nitrogen-and-hydrogen-containing precursor may pass through separate zones (hollow volumes 1051) in the dual-zone showerhead, wherein the separate zones open into the substrate processing region but not into the remote plasma region.

Showerhead 1053 may be configured to serve the purpose of an ion suppressor as shown in FIG. 3A. Alternatively, a separate processing chamber element may be included (not shown) which suppresses the ion concentration traveling into substrate processing region 1070. Lid 1021 and showerhead 1053 may function as a first electrode and second electrode, respectively, so that lid 1021 and showerhead 1053 may receive different electric voltages. In these configurations, electrical power (e.g., RF power) may be applied to lid 1021, showerhead 1053, or both. For example, electrical power may be applied to lid 1021 while showerhead 1053 (serving as ion suppressor) is grounded. The substrate processing system may include a RF generator that provides electrical power to the lid and/or showerhead 1053. The voltage applied to lid 1021 may facilitate a uniform distribution of plasma (i.e., reduce localized plasma) within chamber plasma region 1020. To enable the formation of a plasma in chamber plasma region 1020, insulating ring 1024 may electrically insulate lid 1021 from showerhead 1053. Insulating ring 1024 may be made from a ceramic and may have a high breakdown voltage to avoid sparking. Portions of substrate processing chamber 1001 near the capacitively-coupled plasma components just described may further include a cooling unit (not shown) that includes one or more cooling fluid channels to cool surfaces exposed to the plasma with a circulating coolant (e.g., water).

In the embodiment shown, showerhead 1053 may distribute (via through-holes 1056) process gases which contain oxygen, hydrogen and/or nitrogen and/or plasma effluents of such process gases upon excitation by a plasma in chamber plasma region 1020. In embodiments, the process gas introduced into the RPS 1010 and/or chamber plasma region 1020 through first channel 1012 may contain fluorine (e.g. $CF_4$, $NF_3$ or $XeF_2$). The process gas may also include a carrier gas such as helium, argon, nitrogen ($N_2$), etc. Plasma effluents may include ionized or neutral derivatives of the process gas and may also be referred to herein as a radical-fluorine precursor referring to the atomic constituent of the process gas introduced.

Through-holes 1056 are configured to suppress the migration of ionically-charged species out of the chamber plasma region 1020 while allowing uncharged neutral or radical species to pass through showerhead 1053 into substrate processing region 1070. These uncharged species may include highly reactive species that are transported with less reactive carrier gas by through-holes 1056. As noted above, the migration of ionic species by through-holes 1056 may be reduced, and in some instances completely suppressed. Controlling the amount of ionic species passing through showerhead 1053 provides increased control over the gas mixture brought into contact with the underlying wafer substrate, which in turn increases control of the deposition and/or etch characteristics of the gas mixture. For example, adjustments in the ion concentration of the gas mixture can significantly alter its etch selectivity (e.g., TiO:low K dielectric etch ratios).

In embodiments, the number of through-holes 1056 may be between about 60 and about 2000. Through-holes 1056 may have a variety of shapes but are most easily made round. The smallest diameter 1050 of through-holes 1056 may be between about 0.5 mm and about 20 mm or between about 1 mm and about 6 mm in disclosed embodiments. There is also latitude in choosing the cross-sectional shape of through-holes, which may be made conical, cylindrical or a combination of the two shapes. The number of small holes 1055 used to introduce a gas into substrate processing region 1070 may be between about 100 and about 5000 or between about 500 and about 2000 in different embodiments. The diameter of the small holes 1055 may be between about 0.1 mm and about 2 mm.

Figure 3B:
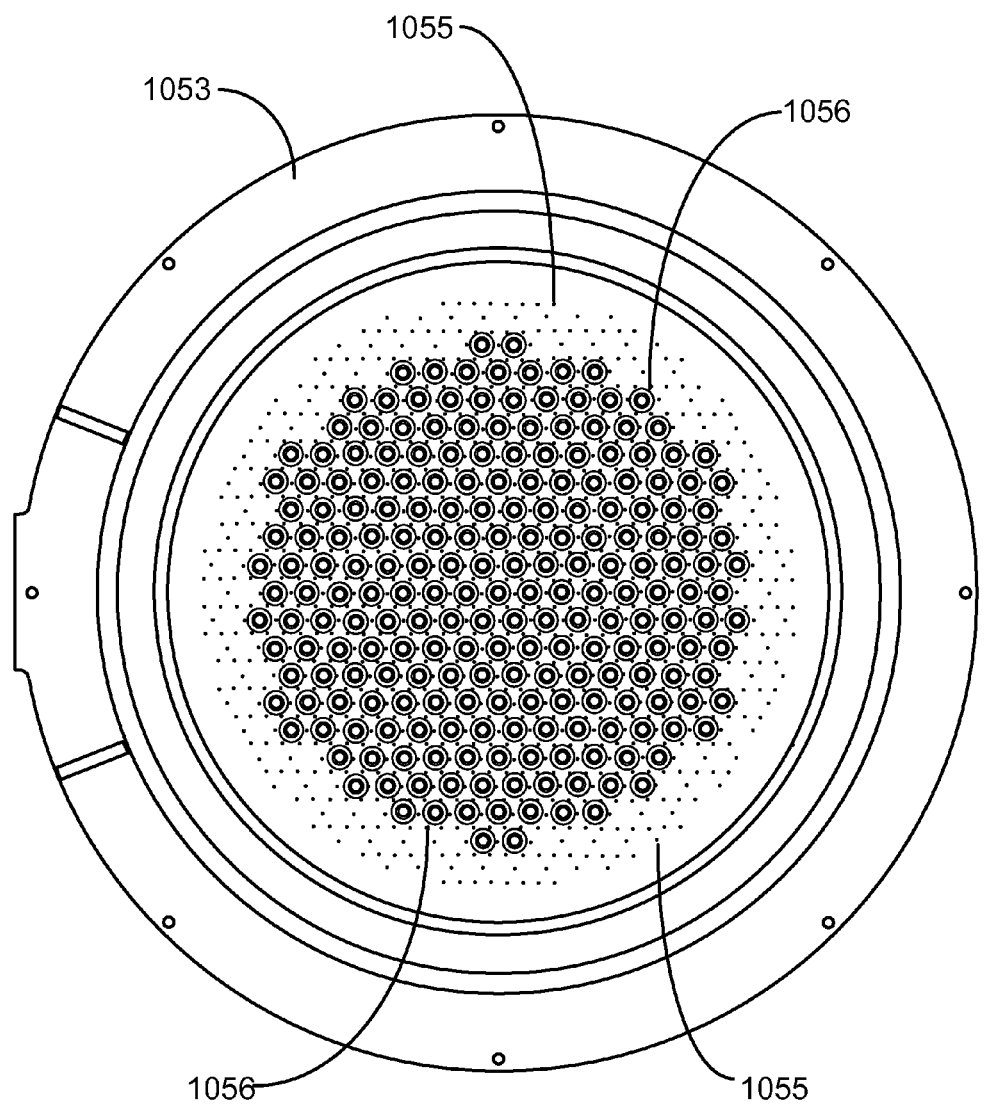
FIG. 3B shows a showerhead of a substrate processing chamber according to embodiments of the invention.

FIG. 3B is a bottom view of a showerhead 1053 for use with a processing chamber according to disclosed embodiments. Showerhead 1053 corresponds with the showerhead shown in FIG. 3A. Through-holes 1056 are depicted with a larger inner-diameter (ID) on the bottom of showerhead 1053 and a smaller ID at the top. Small holes 1055 are distributed substantially evenly over the surface of the showerhead, even amongst the through-holes 1056 which helps to provide more even mixing than other embodiments described herein.

An exemplary patterned substrate may be supported by a pedestal (not shown) within substrate processing region 1070 when fluorine-containing plasma effluents arriving through through-holes 1056 in showerhead 1053 combine with ammonia arriving through the small holes 1055 originating from hollow volumes 1051. Though substrate processing region 1070 may be equipped to support a plasma for other processes such as curing, no plasma is present during the etching of patterned substrate, in embodiments of the invention.

A plasma may be ignited either in chamber plasma region 1020 above showerhead 1053 or substrate processing region 1070 below showerhead 1053. A plasma is present in chamber plasma region 1020 to produce the radical-fluorine precursors from an inflow of the fluorine-containing precursor. An AC voltage typically in the radio frequency (RF) range is applied between the conductive top portion 1021 of the processing chamber and showerhead 1053 to ignite a plasma in chamber plasma region 1020 during deposition. An RF power supply generates a high RF frequency of 13.56 MHz but may also generate other frequencies alone or in combination with the 13.56 MHz frequency.

The top plasma may be left at low or no power when the bottom plasma in the substrate processing region 1070 is turned on to either cure a film or clean the interior surfaces bordering substrate processing region 1070. A plasma in substrate processing region 1070 is ignited by applying an AC voltage between showerhead 1053 and the pedestal or bottom of the chamber. A cleaning gas may be introduced into substrate processing region 1070 while the plasma is present.

The pedestal may have a heat exchange channel through which a heat exchange fluid flows to control the temperature of the substrate. This configuration allows the substrate temperature to be cooled or heated to maintain relatively low temperatures (from room temperature through about 120° C.). The heat exchange fluid may comprise ethylene glycol and water. The wafer support platter of the pedestal (preferably aluminum, ceramic, or a combination thereof) may also be resistively heated in order to achieve relatively high temperatures (from about 120° C. through about 1100° C.) using an embedded single-loop embedded heater element configured to make two full turns in the form of parallel concentric circles. An outer portion of the heater element may run adjacent to a perimeter of the support platter, while an inner portion runs on the path of a concentric circle having a smaller radius. The wiring to the heater element passes through the stem of the pedestal.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

The system controller controls all of the activities of the etching chamber. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

A process for depositing a film stack on a substrate or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

The chamber plasma region or a region in an RPS may be referred to as a remote plasma region. In embodiments, the radical precursor (e.g. a radical-fluorine precursor) is created in the remote plasma region and travels into the substrate processing region to combine with an amine-containing precursor. In embodiments, the amine-containing precursor is excited only by the radical-fluorine precursor. Plasma power may essentially be applied only to the remote plasma region, in embodiments, to ensure that the radical-fluorine precursor provides the dominant excitation to the amine-containing precursor (e.g. ammonia).

In embodiments employing a chamber plasma region, the excited plasma effluents are generated in a section of the substrate processing region partitioned from a deposition region. The deposition region, also known herein as the substrate processing region, is where the plasma effluents mix and react with the amine-containing precursor to etch the patterned substrate (e.g., a semiconductor wafer). The excited plasma effluents may also be accompanied by inert gases (in the exemplary case, argon). The amine-containing precursor does not pass through a plasma before entering the substrate plasma region, in embodiments. The substrate processing region may be described herein as "plasma-free" during the etch of the patterned substrate. "Plasma-free" does not necessarily mean the region is devoid of plasma. Ionized species and free electrons created within the plasma region do travel through pores (apertures) in the partition (showerhead) but the amine-containing precursor is not substantially excited by the plasma power applied to the plasma region. The borders of the plasma in the chamber plasma region are hard to define and may encroach upon the substrate processing region through the apertures in the showerhead. In the case of an inductively-coupled plasma, a small amount of ionization may be effected within the substrate processing region directly. Furthermore, a low intensity plasma may be created in the substrate processing region without eliminating desirable features of the forming film. All causes for a plasma having much lower intensity ion density than the chamber plasma region (or a remote plasma region, for that matter) during the creation of the excited plasma effluents do not deviate from the scope of "plasma-free" as used herein.

Nitrogen trifluoride (or another fluorine-containing precursor) may be flowed into chamber plasma region 1020 at rates between about 25 sccm and about 200 sccm, between about 50 sccm and about 150 sccm or between about 75 sccm and about 125 sccm in different embodiments. Amine-containing precursor may be flowed into substrate processing region 1070 at rates between about 25 sccm and about 200 sccm, between about 50 sccm and about 150 sccm or between about 75 sccm and about 125 sccm in different embodiments.

Combined flow rates of amine-containing precursor and fluorine-containing precursor into the chamber may account for 0.05% to about 20% by volume of the overall gas mixture; the remainder being carrier gases. The fluorine-containing precursor is flowed into the remote plasma region but the plasma effluents has the same volumetric flow ratio, in embodiments. In the case of the fluorine-containing precursor, a purge or carrier gas may be first initiated into the remote plasma region before those of the fluorine-containing gas to stabilize the pressure within the remote plasma region.

Plasma power can be a variety of frequencies or a combination of multiple frequencies. In the exemplary processing system the plasma is provided by RF power delivered to lid 1021 relative to showerhead 1053. The RF power may be between about 10 watts and about 2000 watts, between about 100 watts and about 2000 watts, between about 200 watts and about 1500 watts or between about 500 watts and about 1000 watts in different embodiments. The RF frequency applied in the exemplary processing system may be low RF frequencies less than about 200 kHz, high RF frequencies between about 10 MHz and about 15 MHz or microwave frequencies greater than or about 1 GHz in different embodiments. The plasma power may be capacitively-coupled (CCP) or inductively-coupled (ICP) into the remote plasma region.

Substrate processing region 1070 can be maintained at a variety of pressures during the flow of amine-containing precursor, any carrier gases and plasma effluents into substrate processing region 1070. The pressure may be maintained between about 500 mTorr and about 30 Torr, between about 1 Torr and about 20 Torr or between about 5 Torr and about 15 Torr in different embodiments.

In one or more embodiments, the substrate processing chamber 1001 can be integrated into a variety of multi-processing platforms, including the Producer™ GT, Centura™ AP and Endura™ platforms available from Applied Materials, Inc. located in Santa Clara, Calif. Such a processing platform is capable of performing several processing operations without breaking vacuum. Processing chambers that may implement embodiments of the present invention may include dielectric etch chambers or a variety of chemical vapor deposition chambers, among other types of chambers.

Figure 4:
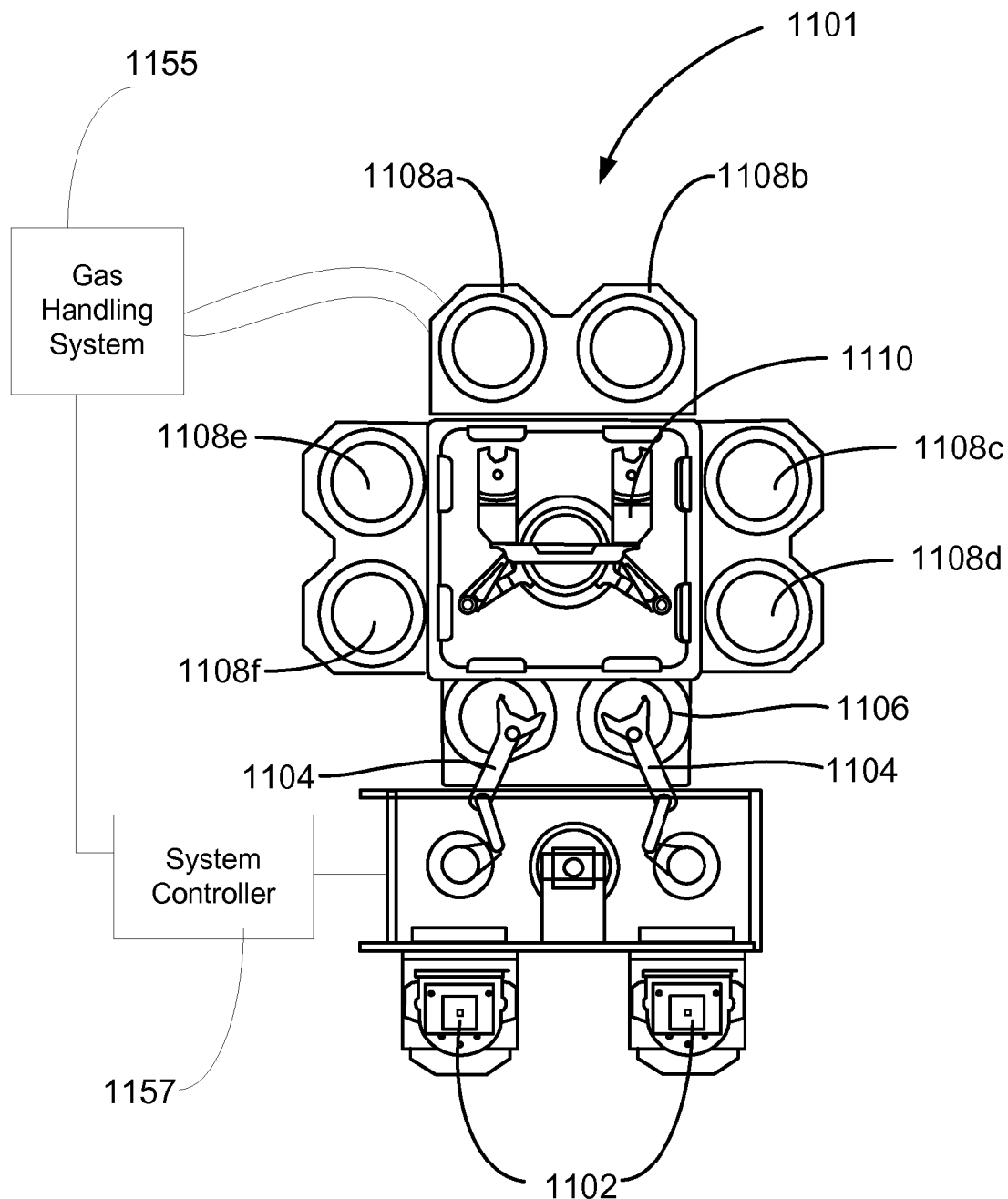
FIG. 4 shows a substrate processing system according to embodiments of the invention.

Embodiments of the deposition systems may be incorporated into larger fabrication systems for producing integrated circuit chips. FIG. 4 shows one such system 1101 of deposition, baking and curing chambers according to disclosed embodiments. In the figure, a pair of FOUPs (front opening unified pods) 1102 supply substrate substrates (e.g., 300 mm diameter wafers) that are received by robotic arms 1104 and placed into a low pressure holding area 1106 before being placed into one of the substrate processing chambers 1108a-f. A second robotic arm 1110 may be used to transport the substrate wafers from the holding area 1106 to the substrate processing chambers 1108a-f and back. Each substrate processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The substrate processing chambers 1108a-f may include one or more system components for depositing, annealing, curing and/or etching a flowable dielectric film on the substrate wafer. In one configuration, two pairs of the processing chamber (e.g., 1108c-d and 1108e-f) may be used to deposit dielectric material on the substrate, and the third pair of processing chambers (e.g., 1108a-b) may be used to etch the deposited dielectric. In another configuration, all three pairs of chambers (e.g., 1108a-f) may be configured to etch a dielectric film on the substrate. Any one or more of the processes described may be carried out on chamber(s) separated from the fabrication system shown in different embodiments.

System controller 1157 is used to control motors, valves, flow controllers, power supplies and other functions required to carry out process recipes described herein. A gas handling system 1155 may also be controlled by system controller 1157 to introduce gases to one or all of the substrate processing chambers 1108a-f. System controller 1157 may rely on feedback from optical sensors to determine and adjust the position of movable mechanical assemblies in gas handling system 1155 and/or in substrate processing chambers 1108a-f. Mechanical assemblies may include the robot, throttle valves and susceptors which are moved by motors under the control of system controller 1157.

In an exemplary embodiment, system controller 1157 includes a hard disk drive (memory), USB ports, a floppy disk drive and a processor. System controller 1157 includes analog and digital input/output boards, interface boards and stepper motor controller boards. Various parts of multi-chamber processing system 1101 which contains processing chamber 1001 are controlled by system controller 1157. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "titanium oxide" of the patterned substrate may be predominantly $TiO_2$ but may include concentrations of other elemental constituents such as nitrogen, hydrogen, carbon and the like. In some embodiments, titanium oxide films etched using the methods disclosed herein consist essentially of titanium and oxygen. Exposed "silicon oxide" of the patterned substrate is predominantly $SiO_2$ but may include concentrations of other elemental constituents such as nitrogen, hydrogen, carbon and the like. In some embodiments, silicon oxide films etched using the methods disclosed herein consist essentially of silicon and oxygen. The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. A "radical-fluorine precursor" is a radical precursor which contains fluorine but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material (e.g. a substantially cylindrical TiN pillar). The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of etching a substrate in a substrate processing region of a substrate processing chamber, wherein the substrate has an exposed titanium oxide region, the method comprising:
   flowing a fluorine-containing precursor into a remote plasma region fluidly coupled to the substrate processing region while forming a remote plasma in the remote plasma region to produce plasma effluents, wherein the remote plasma region is separated from the substrate processing region by a showerhead;
   flowing a nitrogen-and-hydrogen-containing precursor into the substrate processing region without first passing the nitrogen-and-hydrogen-containing precursor through the remote plasma region, wherein the nitrogen-and-hydrogen-containing precursor is flowed through channels in the showerhead that allow it to flow to the substrate processing region and prevent flow to the remote plasma region; and
   etching the exposed titanium oxide region with the combination of the plasma effluents and the nitrogen-and-hydrogen-containing precursor in the substrate processing region.

2. The method of claim 1 wherein the patterned substrate further comprises a second exposed region selected from the group consisting of an exposed low-K dielectric region, an exposed silicon region, an exposed titanium nitride region or an exposed silicon nitride region and the selectivity of the etching operation (exposed titanium oxide region: second exposed region) is greater than or about 50:1.

3. The method of claim 1 wherein the nitrogen-and-hydrogen-containing precursor comprises an amine-containing precursor.

4. The method of claim 1 wherein the nitrogen-and-hydrogen-containing precursor comprises ammonia.

5. The method of claim 1 wherein the substrate processing region is plasma-free while etching the exposed titanium oxide region.

6. The method of claim 1 wherein the nitrogen-and-hydrogen-containing precursor is not excited by any remote plasma formed outside the substrate processing region.

7. The method of claim 1 wherein the fluorine-containing precursor comprises a precursor selected from the group consisting of atomic fluorine, diatomic fluorine, nitrogen trifluoride, hydrogen fluoride and xenon difluoride.

8. The method of claim 1 wherein the operation of flowing the fluorine-containing precursor into the remote plasma region further comprises flowing a hydrogen-containing precursor into the remote plasma region.

9. The method of claim 1 wherein the fluorine-containing precursor flowed through through-holes in a dual-zone showerhead and the nitrogen-and-hydrogen-containing precursor passes through separate zones in the dual-zone showerhead, wherein the separate zones open into the substrate processing region but not into the remote plasma region.

10. The method of claim 1 wherein a temperature of the patterned substrate is greater than or about 70° C. and less than or about 400° C. during the etching operation.

11. The method of claim 1 wherein a temperature of the patterned substrate is greater than or about 150° C. and less than or about 350° C. during the etching operation.

12. A method of etching a substrate in a substrate processing region of a substrate processing chamber, the substrate having an exposed titanium oxide region and a second exposed region selected from the group consisting of an exposed low-K dielectric region, an exposed silicon region, an exposed titanium nitride region or an exposed silicon nitride region, the method comprising:
   flowing ammonia and a fluorine-containing precursor into a remote plasma region fluidly coupled to the substrate processing region while forming a remote plasma in the remote plasma region to produce plasma effluents; and
   etching the exposed titanium oxide region with the plasma effluents in the substrate processing region faster than the second exposed region.

13. The method of claim 12 wherein the selectivity of the etching operation (exposed titanium oxide region: second exposed region) is greater than or about 50:1.

14. The method of claim 12 wherein the substrate processing region is plasma-free while etching the exposed titanium oxide region.

15. The method of claim 12 wherein the nitrogen-and-hydrogen-containing precursor is not excited by any remote plasma formed outside the substrate processing region.

16. The method of claim 12 wherein the fluorine-containing precursor comprises a precursor selected from the group consisting of atomic fluorine, diatomic fluorine, nitrogen trifluoride, hydrogen fluoride and xenon difluoride.

17. The method of claim 12 wherein the operation of flowing the fluorine-containing precursor into the remote plasma region further comprises flowing a hydrogen-containing precursor into the remote plasma region.

18. The method of claim 12 wherein the fluorine-containing precursor flowed through through-holes in a dual-zone showerhead and the nitrogen-and-hydrogen-containing precursor passes through separate zones in the dual-zone showerhead, wherein the separate zones open into the substrate processing region but not into the remote plasma region.

19. The method of claim 12 wherein a temperature of the patterned substrate is greater than or about 70° C. and less than or about 400° C. during the etching operation.

20. The method of claim 12 wherein a temperature of the patterned substrate is greater than or about 150° C. and less than or about 350° C. during the etching operation.

* * * * *